US010224251B2

(12) United States Patent
Moll et al.

(10) Patent No.: US 10,224,251 B2
(45) Date of Patent: Mar. 5, 2019

(54) SEMICONDUCTOR DEVICES AND MANUFACTURING TECHNIQUES FOR REDUCED ASPECT RATIO OF NEIGHBORING GATE ELECTRODE LINES

(71) Applicant: GLOBALFOUNDRIES Inc., Grand Cayman (KY)

(72) Inventors: Hans-Peter Moll, Dresden (DE); Peter Baars, Dresden (DE); Gunter Grasshoff, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 9 days.

(21) Appl. No.: 15/667,017

(22) Filed: Aug. 2, 2017

(65) Prior Publication Data
US 2019/0043764 A1 Feb. 7, 2019

(51) Int. Cl.
*H01L 21/84* (2006.01)
*H01L 27/06* (2006.01)
*H01L 49/02* (2006.01)
*H01L 29/06* (2006.01)
*H01L 29/08* (2006.01)
*H01L 29/78* (2006.01)
*H01L 27/12* (2006.01)

(52) U.S. Cl.
CPC .......... *H01L 21/84* (2013.01); *H01L 27/0629* (2013.01); *H01L 27/1203* (2013.01); *H01L 28/20* (2013.01); *H01L 29/0649* (2013.01); *H01L 29/0847* (2013.01); *H01L 29/7838* (2013.01); *H01L 29/7843* (2013.01)

(58) Field of Classification Search
CPC . H01L 21/84; H01L 27/0629; H01L 27/1203; H01L 28/20; H01L 29/0649; H01L 29/0847; H01L 29/7838; H01L 29/7843
See application file for complete search history.

(56) References Cited

U.S. PATENT DOCUMENTS

| 9,450,381 | B1* | 9/2016 | Cai | G02B 6/122 |
| 2007/0164357 | A1* | 7/2007 | Clevenger | H01L 21/28114 257/347 |
| 2011/0189827 | A1* | 8/2011 | Hsu | H01L 21/8234 438/238 |
| 2014/0183658 | A1* | 7/2014 | Benaissa | H01L 27/0629 257/380 |

\* cited by examiner

*Primary Examiner* — Fernando L Toledo
*Assistant Examiner* — Neil R Prasad
(74) *Attorney, Agent, or Firm* — Amerson Law Firm, PLLC

(57) ABSTRACT

When forming sophisticated semiconductor devices requiring resistors based on polysilicon material having non-silicided portions, the respective cap material for defining the silicided portions may be omitted during the process sequence, for instance, by using a patterned liner material or by applying a process strategy for removing the metal material from resistor areas that may not receive a corresponding metal silicide. By implementing the corresponding process strategies, semiconductor devices may be obtained with reduced probability of contact failures, with superior performance due to relaxing surface topography upon forming the contact level, and/or with increased robustness with respect to contact punch-through.

20 Claims, 12 Drawing Sheets

SEMICONDUCTOR DEVICES AND MANUFACTURING TECHNIQUES FOR REDUCED ASPECT RATIO OF NEIGHBORING GATE ELECTRODE LINES

BACKGROUND

1. Field of the Disclosure

Generally, the present disclosure relates to semiconductor devices and manufacturing techniques in which passive-resistive structures may be provided in complex integrated circuits, including sophisticated transistor elements with raised drain and source architecture in combination with closely spaced gate electrode lines.

2. Description of the Related Art

Significant progress has been made in the field of semiconductor devices, typically including active circuit elements, such as transistors in the form of sophisticated field effect transistors, i.e., transistors comprising drain and source regions and a gate electrode structure. Depending on the overall complexity of a circuit configuration of interest, these transistor elements may be formed on the basis of critical dimensions of 30 nm and even less in sophisticated planar transistor architectures, thereby providing the potential to achieve extremely high integration density, thus offering the possibility to incorporate more and more functions into a single integrated circuit. In such integration schemes, the small signal capabilities of modern integrated circuits may, therefore, be significantly enhanced, while at the same time, the reduced overall dimensions may contribute to the superior speed of critical signal paths and may also result in reduced overall power consumption.

In addition to the active circuit elements in the form of field effect transistors, which typically represent the major part of complex integrated circuits, passive circuit elements are also required, in particular when implementing more and more functions into a single integrated circuit. One important passive electronic component is a resistive structure or resistor, which may be required in many types of analog and digital circuits. Frequently, a resistor may be provided on the basis of a semiconductor material, such as polysilicon, formed above a respective semiconductor layer, wherein the resistance of such semiconductor-based resistors is determined, in addition to the overall geometric configuration, by the characteristics of the respective semiconductor material, which may be adjusted by appropriate treatments, such as the incorporation of dopant species and the like. In order to preserve a high degree of process compatibility with the manufacturing process for forming the sophisticated transistor elements, the introduction of only a low number of process steps specifically related to the formation of the resistor is typically attempted, since most of the specifically resistor-dedicated process steps may typically involve a lithography process, thereby contributing significantly to the overall manufacturing costs. For example, in many manufacturing schemes, the resistors may be formed together with respective gate electrode structures and corresponding conductive lines, also referred to herein as "gate electrode lines," so that, basically, respective resistors may have a very similar configuration, except for the lateral dimensions and resistor-specific material characteristics, compared to the transistor elements.

Although the ongoing scaling of the semiconductor devices may contribute to enhanced performance and increased integration density, there are also certain side effects associated with the ever-decreasing critical dimensions, which may have to be addressed in order to not unduly offset some of the advantageous effects of the device scaling. Hence, a plurality of additional mechanisms are typically implemented in the overall process flow in an attempt to further enhance transistor performance without significantly contributing to additional process complexity.

A very efficient mechanism in this sense is the introduction of stress or strain into certain portions of a transistor element in order to positively influence the charge carrier mobility. Although many different approaches have been developed over the past years, which may involve the incorporation of semiconductor compounds of different lattice constants and the like, in other well-established approaches, so-called "stress liners," i.e., material layers inducing a specific type of strain in certain transistor areas, may be applied, thereby achieving superior performance by increasing current drive capabilities of the respective transistors. One well-established approach in this context is the formation of respective strain-inducing material layers during the formation of a contact level, i.e., a device level in which respective dielectric materials are deposited over the substantially completed transistor elements in order to passivate the transistor elements and form appropriate contact elements, so as to appropriately connect to a metallization system that is to be formed above a contact level. In a corresponding process regime, one or more of the dielectric materials, which may have to be provided anyway with respect to the passivation of the transistor elements, may be provided in the form of a stressed or strain-inducing material, wherein immediate contact with the underlying transistor structure may ensure high efficiency of any such mechanism. For example, silicon nitride material may be deposited so as to induce tensile or compressive strain in underlying material layers by appropriately adapting the deposition conditions and may, therefore, represent a highly efficient mechanism for enhancing charge carrier mobility in P-type and N-type transistors, respectively.

Upon depositing such performance-increasing dielectric materials above the transistor elements, it turns out, however, that, particularly in sophisticated semiconductor devices, a very sophisticated surface topography may be encountered during the deposition process, thereby possibly contributing to reduced efficiency of the strain-inducing mechanism and/or contributing to pronounced device failures, particularly in the contact level.

In view of the situation described above, the present disclosure, therefore, relates to semiconductor devices and manufacturing techniques in which resistors and sophisticated transistors may be formed so as to provide required device characteristics of the resistors and the transistors, while avoiding, or at least reducing, the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the finding that, in particular, the process sequence related to defining non-silicided areas in the resistor material, resulting in respective sidewall spacers of raised drain and source regions and on gate electrode lines formed above isolation regions, may be efficiently replaced by process strategies that do not require the deposition of a respective mask material. In this manner, a significant relaxation, particularly with respect to deposition constraints during the further processing of semiconductor devices, for instance, upon depositing a dielectric material for the contact level, such as a strain-inducing dielectric material and the like, may be accomplished, thereby reducing performance and yield loss, as well as the probability of contact failures.

In one illustrative method disclosed herein, the method includes forming a resistor and a transistor element of a semiconductor device, wherein the transistor element has raised drain and source regions and a gate electrode structure, wherein the gate electrode structure and the resistor are covered by a dielectric cap material. The method further includes forming a mask layer above the transistor elements and the resistor. Furthermore, the method includes patterning the mask layer so as to expose end portions of a top surface of the dielectric cap material above the resistor and to expose a top surface of the dielectric cap material above the gate electrode structure. Additionally, the method includes removing exposed portions of the dielectric cap material by using the patterned mask layer as an etch mask.

In a further illustrative embodiment disclosed herein, the method includes forming herein a resistor and a transistor element having a gate electrode structure, wherein the transistor element has raised drain and source regions and the gate electrode structure and the resistor are covered by a dielectric cap material. The method further includes removing the dielectric cap material so as to expose top surfaces of the resistor and the transistor element. Moreover, the method includes selectively forming a metal-containing layer on end portions of the top surface of the resistor and above the transistor element. Additionally, the method includes forming a metal semiconductor compound in and on semiconductor surface areas that are covered by the metal-containing layer.

A still further illustrative embodiment disclosed herein relates to a semiconductor device. The semiconductor device includes a transistor element including a gate electrode structure and raised drain and source regions positioned laterally adjacent to at least a portion of the gate electrode structure. A distal sidewall of the raised drain and source regions with respect to the gate electrode structure is formed of a first compound of a semiconductor material of the raised drain and source regions and a metal. The semiconductor device further includes a resistor comprising a semiconductor resistor body and contact regions connecting to the resistor body and containing a second compound formed of a semiconductor material of the resistor body and a metal.

BRIEF DESCRIPTION OF THE DRAWINGS

The disclosure may be understood by reference to the following description taken in conjunction with the accompanying drawings, in which like reference numerals identify like elements, and in which.

Figure 1A:
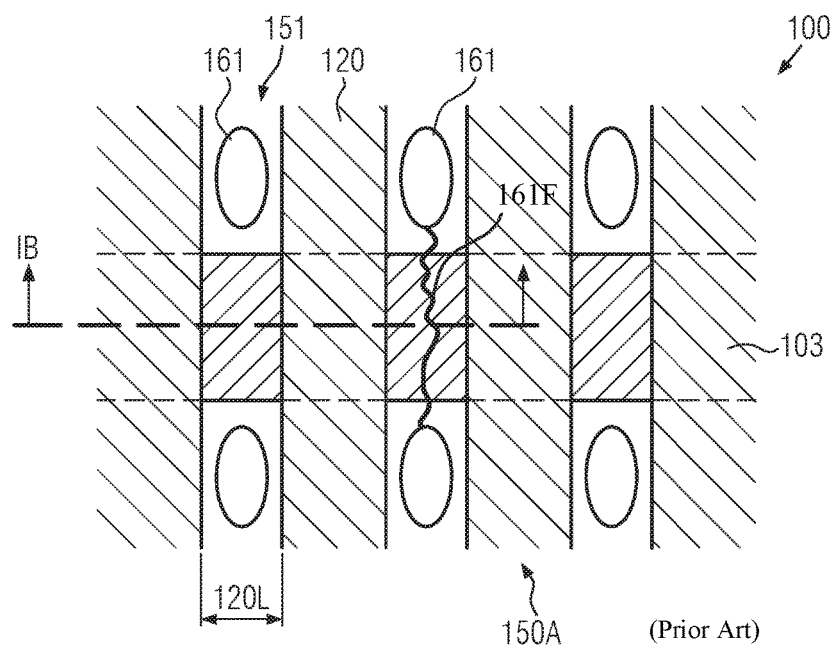
FIGS. 1A and 1B schematically illustrate a top view and a cross-sectional view of a semiconductor device in which deposition-related contact failures may be observed.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

As discussed above, reduced reliability and/or increased probability of generating device failures may encountered. Without intending to restrict the present disclosure to the following explanation, it is believed that a failure mechanism, as will be discussed in more detail with reference to FIGS. 1A-1E, may have a contribution.

FIG. 1A schematically illustrates a top view of a semiconductor device 100, in which transistor elements 150A, such as field effect transistors, may be formed in close proximity to each other, at least in dense circuit areas, on the basis of critical dimensions of 30 nm and even less. That is, the transistor elements 150A may typically comprise drain and source regions 151, which may be provided in the form of a raised configuration, as will be discussed later on in more detail, and a gate electrode structure 120, including a gate dielectric material (not shown) and one or more electrode materials (not shown), a lateral dimension thereof, indicated by 120L, defining a "length" of the gate electrode structure 120. As illustrated, a lateral dimension of the drain and source regions 161 and also the respective lateral distance of respective transistor elements 150A may be comparable to the gate length 120L and may, therefore, be in a range of 80 nm and even less for a gate length 120L of 30 nm and less. Moreover, the transistor elements 150A may typically be separated by an isolation structure 103, frequently provided in the form of a shallow trench isolation and the like, wherein, in the portion shown in FIG. 1A, a horizontally extending isolation structure 103 separates the respective transistor elements 150A in the orthogonal lateral direction, which, in FIG. 1A, is represented by the vertical direction. On the other hand, the respective electrode gate structures 120 may extend from one transistor element to another across the isolation structure 103 as illustrated, thereby forming a plurality of adjacent gate electrode lines above the respective portion of the isolation structure 103.

As discussed above, when applying a performance-enhancing mechanism, such as a strain-inducing mechanism, by forming a corresponding strain-inducing material layer above respective transistor elements, the transistors 150A and, in particular, the gate electrode structures 120 above the isolation structure 103 may result in a highly sophisticated surface topography, since the height of the gate electrode structures 120 may not be arbitrarily reduced, since a specific desired minimum gate conductivity may be required for proper operation of the transistor elements 150A. Consequently, for a gate height of several 10 nm and a distance between neighboring gate electrode lines of 80 nm and significantly less, a substantially void-free deposition of the strain-inducing dielectric material may require highly sophisticated deposition strategies.

It turns out, however, that, in particular, the incorporation of sophisticated resistor elements formed on the basis of semiconductor materials, which may also be used for the gate electrode structures 120, may require the deposition of additional dielectric material in a final phase of forming the transistor elements, as will be discussed later on in more detail, thereby reducing the effective distance even further and, thus, increasing the respective aspect ratio for the spaces between the adjacent gate electrode structures 120. In particular, when implementing the stress liner approach in a process flow for forming sophisticated semiconductor devices on the basis of a circuit design as described with reference to FIG. 1A, it appears that increased yield loss may occur, which may be contributed to certain contact failures, as schematically indicated by 161F, wherein a conductive path may have been unintentionally formed between two otherwise non-related contact elements 161 during the previous processing. It is assumed that a respective contact failure 161F may be closely related to the pronounced surface topography caused by the gate electrode structures 120, in particular, above the isolation structure 103.

Figure 1B:
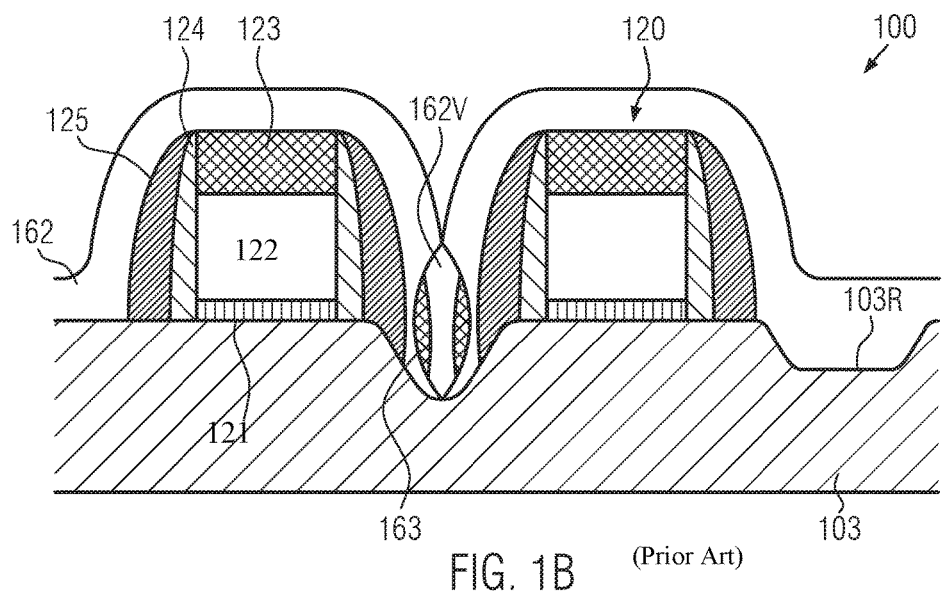

FIG. 1B schematically illustrates a cross-sectional view of the semiconductor device 100 taken along the line IB of FIG. 1A. As illustrated, the semiconductor device 100 comprises the gate electrode structures 120, a portion of which is formed on the isolation structure 103, which may be provided in the form of a silicon dioxide material and the like. Furthermore, it should be appreciated that the isolation structure 103 may, itself, exhibit a certain topography caused by respective recesses 103R, which may be mainly created adjacent to the gate electrode structure 120 due to specific treatments and cleaning processes associated with the formation of the sophisticated gate electrode structures 120 and other related processes required for sophisticated transistor elements. The gate electrode structure may typically comprise a gate dielectric material 121, wherein at least a portion thereof may be formed above the isolation structure 103 when the gate dielectric material 121 or at least a portion thereof may be formed on the basis of deposition processes. In other cases, when the gate dielectric material 121 may be basically formed by applying oxidation processes, the gate dielectric material 121 or a respective portion formed by oxidation in semiconductor areas, may not be present on the isolation structure 103. Furthermore, the gate electrode structures 120 may comprise one or more electrode materials 122, such as highly doped silicon material, silicon/germanium, and the like, possibly in combination with metal-containing materials positioned immediately above the gate dielectric material 121, depending on the overall complexity of the transistor elements in the semiconductor device 100. Furthermore, a portion of the semiconductor material of the electrode material 122 may be converted into a metal semiconductor compound 123, such as a nickel silicide, nickel/platinum silicide and the like.

Moreover, a sidewall spacer 124 may be provided on sidewalls of the materials 121, 122 and 123, which may be required for encapsulating the gate electrode materials. Furthermore, as previously discussed, in sophisticated circuit designs, resistors may also have to be provided, which may basically have a configuration similar to the gate electrode structures 120, except for respective lateral dimensions thereof. Moreover, in order to obtain higher resistance values, the formation of the metal semiconductor compound 123 in the respective resistor structures frequently has to be avoided and the metal semiconductor compound has to be restricted to respective contact regions of the resistor in order to comply with the overall design requirements. For this reason, it may be typically required to form a respective mask layer above specific portions of the resistors, wherein a corresponding etch process may result in further sidewall spacers 125 for the gate electrode structures 120, thereby reducing the lateral distance between adjacent gate electrode lines even further.

Consequently, upon forming a dielectric material 162, such as a strain-inducing silicon nitride layer or any other appropriate material layer, the respective deposition process encounters a highly complex surface topography, thereby possibly causing respective voids 162V between respective gate electrodes 120, as indicated in FIG. 1B. Although the formation of the voids 162V may basically represent per se a cause for further reliability and/or performance issues due to the incomplete deposition of the strain-inducing material 162, the situation may gain even further in importance during the further manufacturing process. That is, upon depositing at least one further dielectric material 163, such as silicon dioxide and the like, and planarizing the respective surface topography, contact openings (not shown) may be subsequently formed for the contact elements 161 (see FIG.

1A), wherein, in some cases, a respective void 162V may be "opened," thereby establishing a connecting channel between the respective contact opening and the void 162V. Upon depositing a highly conductive material, such as tungsten, possibly in combination with a respective barrier, such as titanium silicide and the like, a portion of the corresponding metal material, indicated by 163, may also accumulate within the void 162V, thereby forming an undesired conductive path, which may even result in a short circuit between adjacent contact elements, as illustrated in FIG. 1A by the contact failure 161F.

Figure 1C:
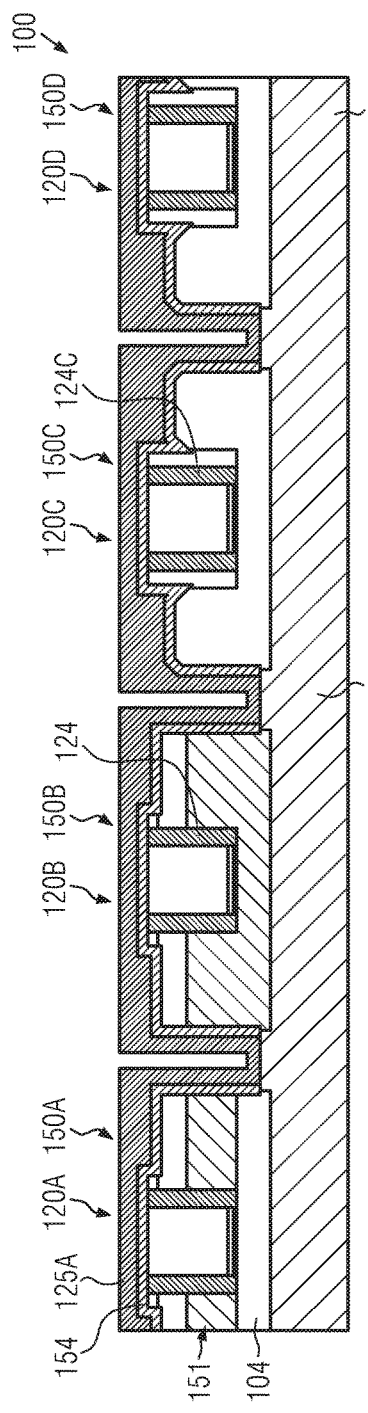
FIGS. 1C and 1D schematically illustrate cross-sectional views of a semiconductor device during various manufacturing stages, wherein the cross-section is taken through a region of closely spaced transistor elements.
Figure 1D:
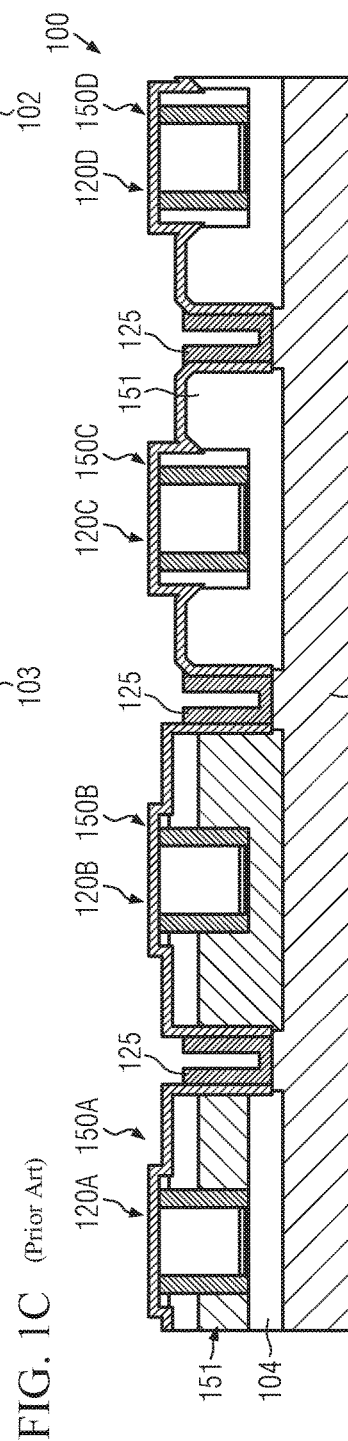

With reference to FIGS. 1C and 1D, the situation of a highly sophisticated surface topography is illustrated for different types of closely spaced transistor elements, wherein the sophisticated resulting surface topography may also affect transistor performance due to the necessity of forming additional sidewall spacers for appropriately masking respective resistor elements.

FIG. 1C schematically illustrates a cross-sectional view of the semiconductor device 100 in a device area in which a plurality of transistors 150A-150D is formed in a densely packed device region. As illustrated, the semiconductor device 100 may include a buried insulating layer 102, when a silicon (or semiconductor)-on-insulator (SOI) architecture is considered. Furthermore, a semiconductor layer 104 may be provided in the respective transistor elements and may have any configuration considered appropriate for the various transistors 150A-150D. For instance, the transistors 150A-150D may represent transistors of different conductivity types and performance, thereby possibly requiring different composition, dopant concentration and the like, in the respective semiconductor layers 104.

By way of example, the transistor 150A may represent a P-type transistor with reduced performance requirements, wherein a silicon-based material may substantially suffice for the semiconductor layer 104, while the transistor 150B may represent a performance-type transistor, which may require a specifically designed channel region, for instance, in the form of a silicon/germanium alloy, in the semiconductor layer 104. Similarly, the transistors 150C, 150D may represent respective N-type transistors of a performance type and a less performance driven transistor, possibly provided so as to be operated at higher supply voltage, and the like. Furthermore, as illustrated, the transistors 150A-150D may have the drain and source regions 151 as a raised configuration, wherein an appropriately in situ doped semiconductor material is provided so as to extend to a height level that is comparable with a height level of a top surface of the respective gate electrode structures 120A-120D. For example, the raised drain and source regions 151 for P-type transistors may have included therein an in situ doped silicon/germanium alloy followed by a silicon material so as to provide superior conditions during a later process sequence for forming a metal semiconductor compound in any exposed semiconductor surface areas. On the other hand, the N-type transistors 150C, 150D may have the raised drain and source regions in the form of highly doped silicon material.

Furthermore, depending on the conductivity type of the respective transistors, the gate electrode structures 120A-120D may differ from each other with respect to the sidewall spacers, the thickness of which may differ depending on the applied previous process sequence for removing a dielectric cap material that may have been previously used for patterning the gate electrode structures 120A-120D. For instance, the gate electrode structures 120A, 120B of the P-type transistor elements 150A, 150B may comprise the sidewall spacer 124, as also discussed above with reference to FIGS. 1A and 1B, while the gate electrode structures 120C, 120D may comprise a modified spacer 124C having an increased thickness. Furthermore, in this manufacturing stage, a moderately thin cap material 154, for instance, in the form of silicon nitride, silicon dioxide and the like, may be formed in the corresponding transistor elements 150A-150D, followed by a further mask material 125A, for instance, provided in the form of a silicon nitride material, which may cover the transistor elements 150A-150D and also respective resistors (not shown), a portion of which may have to be masked by means of the material 125A during a subsequent process sequence for forming the metal semiconductor compound in any exposed semiconductor surface areas, as already discussed above. Consequently, the cap material 125A may also be formed in the respective spaces between adjacent transistor elements and may, therefore, also contribute to a very pronounced surface topography.

The semiconductor device 100 as illustrated in FIG. 1C may be formed on the basis of the following processes. A semiconductor layer 104 may be provided in combination with the buried insulating layer 102 as an appropriate SOI substrate, which may be subjected to a well-established process sequence for forming the isolation structures 103 and appropriately preparing the required material composition of the semiconductor layer 104 in the respective device areas. Furthermore, respective implantation processes may be performed, for instance, into a semiconductor material provided below the buried insulating layer 102 so as to obtain a desired overall configuration for the transistors 150A-150D. Thereafter, a respective process sequence may be applied in order to form gate dielectric material or materials and the electrode materials of the gate electrode structures 120A-120D, wherein certain differences in the gate dielectric material and possibly in the electrode material may have to be taken into account when forming the gate electrode structures 120A-120D for the different types of transistors 150A-150D. As already discussed, the sophisticated process for patterning the gate electrode structures 120A-120A may, in some sophisticated approaches, involve the deposition of a dielectric cap material (not shown), for instance, in the form of silicon nitride, silicon dioxide and the like, which may be subsequently patterned and used as an etch mask for further patterning the remaining gate materials. Thereafter, the resulting gate electrode structures, including the dielectric cap material, may be encapsulated by forming the sidewall spacers 124, 124C, wherein respective selective epitaxial growth techniques may also be intermittently applied in order to form the raised drain and source regions 151 so as to exhibit the desired dopant concentration and material composition. Thereafter, the cap material 154 may be typically deposited so as to ensure proper encapsulation of the gate electrode structures 120A-120D and the raised drain and source regions 151.

It should be appreciated that the previously described process sequence may also be applied to respective resistors (not shown) which may have, except for the overall geometric configuration, a configuration similar to one or more of the transistor types 150A-150D and, in particular, which may have a configuration comparable to the gate electrode structures 120A-120D. As discussed, the mask material 125A may have to be deposited in order to form a respective deposition mask for the subsequent process sequence for forming a highly conductive metal semiconductor compound. To this end, the material 125A is deposited in a highly conformal manner and may be subsequently removed from horizontal device portions by well-established anisotropic etch techniques.

FIG. 1D schematically illustrates a cross-sectional view of the semiconductor device 100 after completing the above-described process sequence. That is, after completing the respective anisotropic etch sequence, the mask layer 125A (see FIG. 1C) has been removed from horizontal device areas, thereby forming respective sidewall spacers 125 adjacent to the raised drain and source regions 151. It should be appreciated that the spacers 124 and the spacers 124C of FIG. 1C may, therefore, be formed during the same process sequence, wherein the spacers 125 are positioned adjacent to the respective portions of the gate electrode structures above the isolation regions 103 (see FIG. 1B), while the spacers of FIG. 1D are, thus, formed adjacent to the respective transistor elements 150A-150D, i.e., adjacent to the raised drain and source regions 151, thereby also contributing to a significantly pronounced aspect ratio between the various neighboring transistors and resulting in respective deposition failures in these spaces between the neighboring transistor elements 150A-150D. Consequently, as already discussed above with reference to FIGS. 1A and 1B, after the deposition of a corresponding strain-inducing material, such as the dielectric material 162 of FIG. 1B, the generation of voids and a corresponding reduced efficiency of the strain-inducing mechanism may be observed.

Figure 1E:
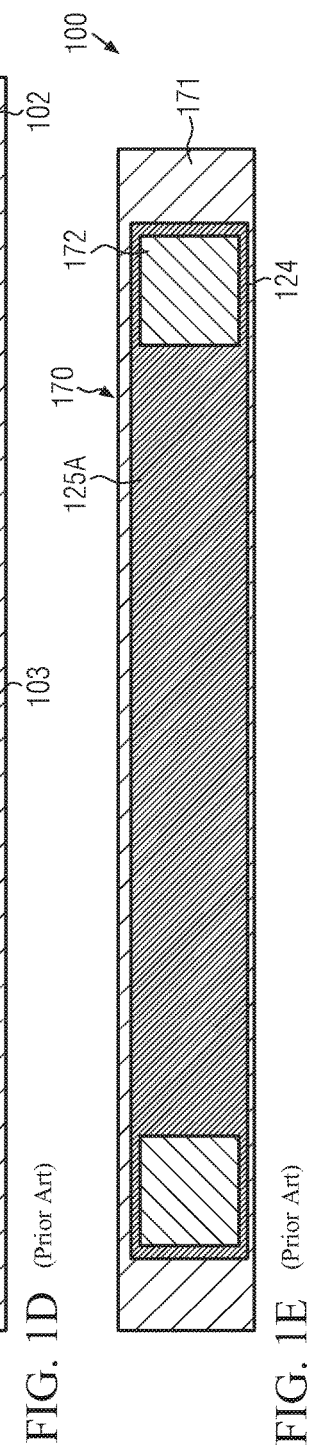
FIG. 1E schematically illustrates a top view of the semiconductor device showing a resistor element formed on the basis of a conventional mask material.

FIG. 1E schematically illustrates a different portion of the semiconductor device 100, in which a resistor 170 may be provided in accordance with overall circuit requirements, as already discussed above. In this manufacturing stage, the resistor 170 may have a configuration similar to one of the gate electrode structures 120A-120D and may, in particular, comprise a semiconductor-based "electrode" material 172, such as polysilicon, silicon/germanium, and the like. Furthermore, raised "drain and source" regions 171 may be formed adjacent to the electrode material 172, separated therefrom by the respective spacers 124, 124C (see FIG. 1C), depending on the process scheme used for forming the resistor 170. That is, if the resistor 170 may be formed in accordance with a process strategy similar to the gate electrode structures 120C, 120D, the spacer structure 124C may be present, while in other cases, the spacer 124 may have been formed during the previous process sequence.

Furthermore, as already discussed above, the main portion of the electrode material 172 may still be covered by the mask layer 125A in order to prevent the formation of any metal semiconductor compound therein in a subsequent process sequence, as discussed above. On the other hand, respective contact windows or regions may be defined by the mask layer 125A, wherein, for convenience, it may be assumed that any further protective materials and layers may have already been removed during a respective cleaning process for preparing exposed semiconductor surface areas for the subsequent process sequence for forming a metal semiconductor compound, such as a nickel silicide, a nickel/platinum silicide and the like. During a respective cleaning process, any other semiconductor-based regions may also be exposed at substantially horizontal surface portions, such as the top surface areas of the gate electrode structures 120A-120D and the top surface areas of the raised drain and source regions 151 (see FIGS. 1C, 1D).

As a consequence, during the further processing, deposition-related failures and resulting performance loss and/or yield loss may have to be anticipated in densely packed device areas, and such failure mechanisms may gain even further importance upon further device scaling. On the other hand, introducing further process steps for appropriately masking respective elements without unduly affecting gate electrode structures and transistor elements during the further processing may significantly contribute to increased overall manufacturing costs, thereby rendering such approaches less than desirable.

The present disclosure is therefore generally based on the finding that, in particular, the patterning of a mask material used for defining portions of resistors that may be covered during a subsequent process sequence for forming a metal semiconductor compound may result in a significant increase of the overall aspect ratio in sophisticated device topographies, thereby potentially reducing device performance, contributing to contact failures, reducing production yield and the like, as already discussed above. Therefore, in some illustrative embodiments disclosed herein, advantage may be taken of previously formed mask materials in order to avoid the deposition and patterning of a further mask material for defining exposed and non-exposed portions during the metal semiconductor compound formation in transistors and resistors. To this end, it has been recognized that a liner or mask material used for protecting sidewall areas of transistor elements, in particular, of gate electrode structures, upon removing a dielectric cap material used for patterning the gate electrode structures, may also be advantageously used for defining exposed and non-exposed areas in resistors in a subsequent process sequence. Consequently, the deposition of a further mask material and, in particular, the formation of respective sidewall spacers thereof upon defining the exposed and non-exposed areas of resistors may be omitted, thereby not only contributing to superior deposition conditions during the subsequent deposition of dielectric materials, such as strain-inducing dielectric materials, but also achieving superior device performance and reduced overall contact failures.

In other illustrative embodiments disclosed herein, avoiding the formation of an additional mask material for defining exposed and non-exposed resistor areas during the metal semiconductor compound formation may be achieved by appropriately patterning the corresponding metal species itself, thereby also arriving at a significantly relaxed overall surface topography during the subsequent process sequence. The patterning of the metal species, such as nickel, platinum, or any combination thereof, and the like, may be achieved on the basis of lithography masks, such as resist masks in the form of polymer material, while, in still other illustrative embodiments, a hard mask material, such as silicon dioxide, silicon nitride and the like, may be used to reliably define exposed and non-exposed areas in the resistors.

In addition to superior device performance and/or reduction of contact failures, a reduced overall process complexity may be typically achieved, since a respective process module may be replaced by a reduced number of process steps, thereby contributing to accelerated processing and, thus, to reduced overall production costs. Furthermore, when forming a metal semiconductor compound in exposed semiconductor surface areas, the principles disclosed herein may provide the potential of increasing the overall surface area, in particular, of raised drain and source regions, thereby also contributing to reduced overall contact resistance and increased robustness during a corresponding process for forming contact elements, since slight misalignment may no longer result in penetration into the raised drain and source regions.

With reference to FIGS. 2A-2H, 3A-3E, and 4A-4G, further illustrative embodiments of the present disclosure will be described in more detail, wherein reference may be made to FIGS. 1A-1E, if appropriate.

Figure 2A:
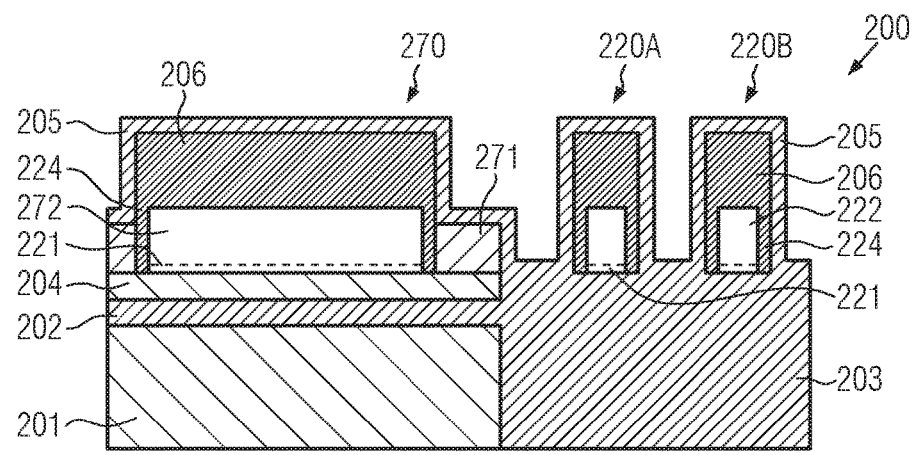
FIGS. 2A-2H schematically illustrate cross-sectional views of a semiconductor device during the various manufacturing stages of forming a resistor and transistor elements on the basis of a process sequence without forming a specific mask material for defining exposed and covered portions of resistors, according to illustrative embodiments.

FIG. 2A schematically illustrates a cross-sectional view of a semiconductor device 200 in a moderately advanced manufacturing stage. As illustrated, the semiconductor device 200 may comprise a substrate 201, such as a semiconductor substrate formed of silicon, germanium, silicon/germanium and the like, or may comprise any other appropriate carrier material. In some illustrative embodiments, the semiconductor device 200 may comprise a plurality of circuit elements formed on the basis of an SOI configuration, in which a buried insulating layer 202, such as a silicon dioxide layer or any other appropriately engineered dielectric material, may be positioned to separate a crystalline semiconductor layer 204 from the substrate material 201, at least in certain device areas receiving circuit elements, such as resistors, transistors and the like. Moreover, as already discussed with reference to FIGS. 1A-1E, the semiconductor layer 204 used for the formation of circuit elements, such as resistors and transistor elements, may be comprised of any appropriate material, such as silicon, silicon/germanium, silicon/carbon and the like, depending on performance requirements of respective circuit elements. In some illustrative embodiments disclosed herein, the semiconductor layer 204 may have a reduced thickness in order to allow the establishment of a fully depleted device configuration for transistor elements, which may be accomplished by reducing a thickness of the semiconductor material 204 to 15 nm and significantly less, such as 10 nm and less.

In the region shown in FIG. 2A, a resistor 270 may be formed on and above the semiconductor layer 204 and, thus, the resistor 270 may be laterally delineated by an isolation structure 203, such as a trench isolation structure having a desired depth and comprising an appropriate dielectric material, such as silicon dioxide, silicon nitride and the like. As previously discussed, in some areas of the isolation structure 203, closely spaced gate electrode structures 220A, 220B, also referred to herein as gate electrode lines, may be provided and may, for instance, represent a portion of respective gate electrode structures formed above respective device areas and being connected by the gate electrode structures 220A, 220B, as shown FIG. 1A. That is, transistor areas may extend in a direction perpendicular to the drawing plane of FIG. 2A in respective device areas having incorporated therein a corresponding semiconductor layer similar to the semiconductor layer 204 and gate electrode structures representing the continuation of the gate electrode lines or structures 220A, 220B, as also previously discussed with reference to the conventional semiconductor device 100 shown in FIGS. 1A-1E.

In the manufacturing stage shown, the resistor 270 and the gate electrode structures 220A, 220B may have a very similar configuration, except for lateral dimensions, as already discussed above. That is, the resistor 270 may comprise an electrode material 272 which may be formed of polysilicon, silicon/germanium or any other appropriate semiconductor material, including a significant portion of silicon in order to provide a high degree of compatibility during the further processing with well-established CMOS techniques. Similarly, the gate electrode structures 220A, 220B may have formed therein an electrode material 222 having substantially the same composition and configuration as the electrode material 272 of the resistor 270, except for dopant concentration and the like.

For example, in some cases, it may be desirable to provide different conductivities for the gate electrode structures 220A, 220B and the resistor 270, which may be accomplished by appropriately adjusting the dopant concentration in the material 272. Moreover, the resistor 270 may comprise a "gate dielectric material" 221 which may have a configuration similar to that material which is used for one or more of the gate electrode structures 220A, 220B. In sophisticated applications, additional metal-including species may be implemented in the gate dielectric material 221 and/or the electrode material 272, depending on the overall configuration required in the respective gate electrode structures 220A, 220B. Hence, a respective gate dielectric material 221 may also be present in the gate electrode structures 220A, 220B, except for any oxidized portions above the isolation structure 203, as already discussed above with reference to the conventional semiconductor device 100.

Furthermore, in this manufacturing stage, the resistor 270 and the gate electrode structures 220A, 220B may still be covered by a dielectric cap material 206, such as silicon nitride, silicon dioxide and the like, which may have been used for patterning the underlying electrode materials 272, 222. Moreover, raised semiconductor regions 271, which may also be referred to as raised drain and source regions in transistor areas (not shown), may be formed adjacent to the electrode material 272 and may be separated therefrom by respective sidewall spacers 224, which are also present on sidewalls of the gate electrode structures 220A, 220B. Consequently, any raised drain and source regions and the regions 271 may be electrically isolated from the corresponding electrode materials 272, 222. Moreover, a mask material 205 may be formed so as to cover any exposed surface areas of the semiconductor device 200 and, in particular, any sidewall areas and top surface areas of the resistor 270 and the gate electrode structures 220A, 220B. For example, the mask material 205 may be provided in the form of a silicon dioxide material having a high etch selectivity with respect to the material of the cap material 206, thereby providing protection of any underlying material layers during a subsequent process sequence when exposed portions of the cap material 206 may have to be removed from the resistor 270 and the gate electrode structures 220A, 220B. For instance, silicon dioxide and silicon nitride are well-established dielectric materials exhibiting a high etch selectivity with respect to a plurality of wet chemical and plasma-assisted etch recipes. A thickness of the mask material 205 may range from approximately 5-20 nm and even higher, depending on the overall device dimensions. For instance, in some illustrative embodiments, critical device dimensions may be represented by the gate length of the gate electrode structures 220A, 220B, i.e., in FIG. 2A, the horizontal dimension of the electrode materials 222, of 30 nm and even less.

The semiconductor device 200 illustrated in FIG. 2A may be formed on the basis of the following processes. After forming the isolation structures 203 in accordance with well-established techniques and after having prepared the respective semiconductor layers 204 with respect to material composition, desired thickness, dopant concentration and the like, and after having introduced dopant species into the material 201, if required, the gate electrode structures 220A, 220B and the resistor 270 may be formed on the basis of sophisticated, yet well-established, process strategies. During the corresponding process sequence, appropriate materials for the gate dielectric materials may be deposited and/or may be formed by oxidation, followed by the deposition of other gate dielectric materials, such as high-k dielectric materials, if required, and followed by the deposition of one or more electrode materials, for instance, including metal species, depending on the overall complexity of the respective gate electrode structures and transistor elements to be formed.

Thereafter, the semiconductor-based electrode material 272, 222 may be formed, for instance, by depositing a substantially amorphous silicon material, a silicon/germanium material and the like, incorporating appropriate dopant species, for instance, by implantation, and at least partially re-crystallizing the semiconductor-based material on the basis of appropriate anneal techniques. It should be appreciated that, depending on the overall process strategy, one or more of these processes may also be performed after having formed the cap material 206, for instance, in the form of a silicon nitride material, possibly in combination with a thin silicon dioxide layer and the like, followed by the patterning of the cap material 206 on the basis of sophisticated, yet well-established, lithography techniques. After having patterned the cap material 206, this material may be used for the further patterning of the electrode materials 272, 222 and the gate dielectric material 221, thereby defining the lateral dimensions of the resistor 270 and, in particular, the gate length of the gate electrode structures 220A, 220B.

Thereafter, respective spacer materials in combination with appropriate masking regimes may be applied so as to encapsulate the gate electrode structures 220A, 220B, thereby also encapsulating the resistor 270 with respect to the further processing. During this further processing, respective crystalline surface areas of exposed portions of the semiconductor layer 204 of the resistor 270 and also of transistor areas (not shown) may be prepared for corresponding selective epitaxial growth processes in order to form respective in situ doped semiconductor materials, such as silicon/germanium, silicon and the like, with a desired dopant concentration as demanded by the overall device requirements. Consequently, during one of these epitaxial growth processes, the raised semiconductor regions 271 of the resistor 270 may also be grown. Thereafter, the mask material 205 may be formed on the basis of a material having a high etch selectivity with respect to at least the main portion of the cap material 206, as discussed above, with appropriate thickness so as to cover any exposed surface areas. To this end, well-established deposition techniques are available. The mask material 205 may, in particular, protect any exposed sidewall surface areas during a subsequent removal of the cap material 206.

Figure 2B:
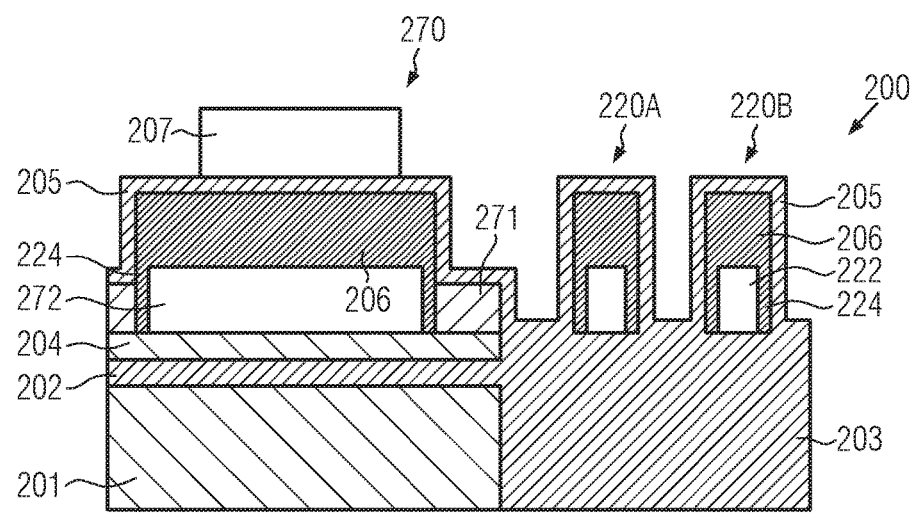

FIG. 2B schematically illustrates a cross sectional-view of the semiconductor device 200 in a further advanced manufacturing stage. As illustrated, a resist mask 207 may be formed above the resistor 270 in order to appropriately define the lateral size and shape of portions of the electrode material 272, which may not receive a metal semiconductor compound in a later manufacturing stage. The resist mask 207 may be formed on the basis of well-established lithography techniques, including the deposition of an appropriate resist material, followed by well-established process steps for preparing the resist material for the subsequent exposure and removal of exposed or non-exposed portions of the resist material, depending on the type of resist material used.

Figure 2C:
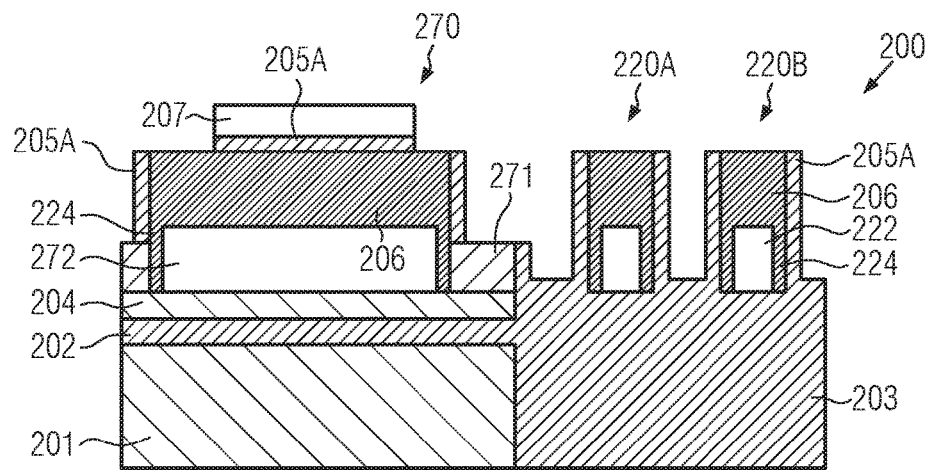

FIG. 2C schematically illustrates the semiconductor device 200 in a further advanced manufacturing stage. As illustrated, portions of the mask layer 205 (see FIG. 2B) may be present on sidewalls of the resistor 270 and the gate electrode structures 220A, 220B and may be referred to as 205A. Furthermore, a respective portion 205A may also be formed above the cap material 206 and may still be covered by the resist mask 207, which may have suffered a certain degree of material loss during a preceding substantially anisotropic etch process for removing the mask material from horizontal portions of the semiconductor device 200 while, nevertheless, preserving the material as the portions 205A on respective sidewall areas of the gate electrode structures 220A, 220B, the electrode material 272, and any raised drain and source regions, such as the regions 271. Respective anisotropic etch recipes, for instance, for silicon dioxide, are well established in the art.

Figure 2D:
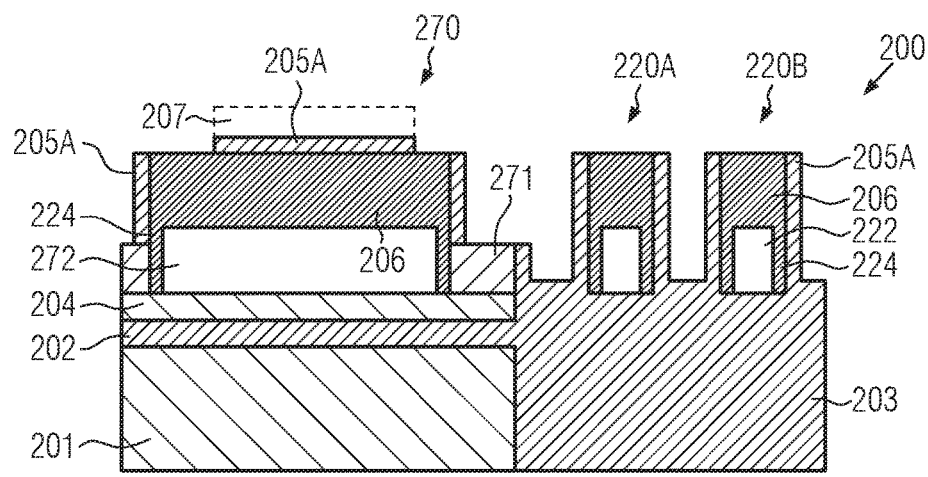

FIG. 2D schematically illustrates the semiconductor device 200 in a further advanced manufacturing stage after removal of the resist mask 207, which may be accomplished on the basis of well-established plasma-assisted resistor removal processes, followed by a cleaning sequence for preparing any exposed device areas, in particular, any exposed barriers of the cap material 206 for a subsequent etch process, in order to remove exposed portions of the cap material 206.

Figure 2E:
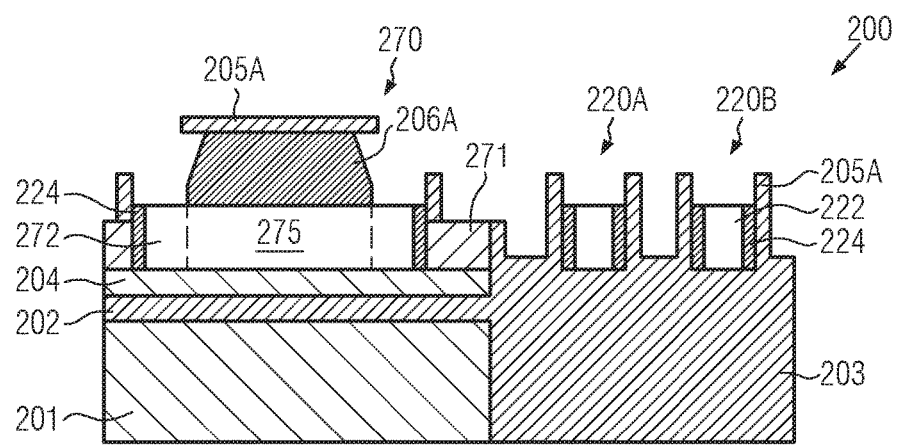

FIG. 2E schematically illustrates a cross-sectional view of the semiconductor device 200 in a further advanced manufacturing stage. As illustrated, portions of the cap material 206 (see FIG. 2D) may be removed in the resistor 270, thereby preserving a portion 206A which may, thus, define the lateral size and shape of a resistor body 275 of the resistor 270. Moreover, the cap material 206 may have been removed in the gate electrode structures 220A, 220B while substantially preserving the sidewall spacers 224, which may be formed of a material similar to the cap material 206. To this end, well-established selective etch recipes, for instance, a wet chemical etch process on the basis of hot phosphoric acid, may be applied to the semiconductor device 200, wherein hot phosphoric acid provides a high removal rate of silicon nitride material, while having a significantly reduced etch rate with respect to silicon dioxide. Consequently, the silicon nitride material on top of the gate electrode structures 220A, 220B may be efficiently removed. Due to the mask material 205A at the sidewalls, the etch attack may be substantially restricted to the vertical direction, thereby allowing preservation of the sidewall spacers 224 on the basis of a controlled etch time. Similarly, at the foot of the portion 206A, the controlled etch time may also provide a precise lateral definition of the resistor body 275, while an upper portion of the cap material 206A may have reduced lateral dimensions due to prolonged exposure to the wet chemical etch ambient. In other illustrative embodiments, a plasma-assisted process may be applied in combination with or alternative to the wet chemical removal of exposed portions of the cap material, thereby substantially avoiding a corresponding tapered form of the cap material 206A in the resistor 270.

Figure 2F:
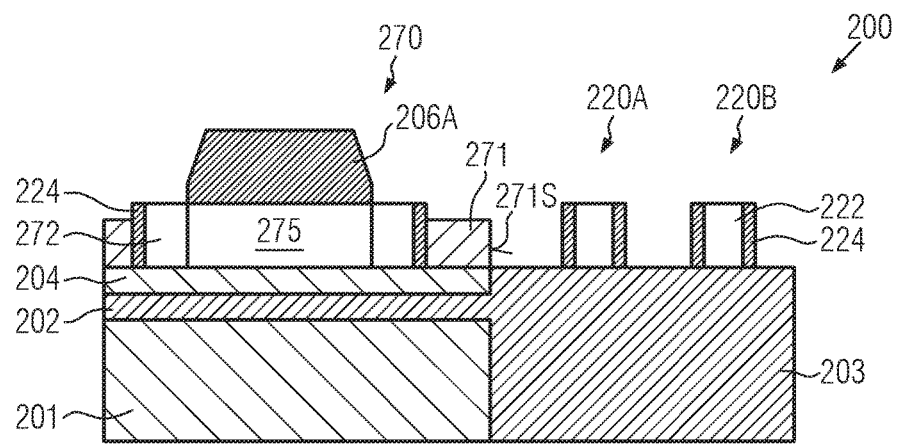

FIG. 2F schematically illustrates the semiconductor device 200 after a further process step, including removal of any residues of the portions 205A (see FIG. 2E), which may be accomplished on the basis of a wet chemical cleaning recipe, including the application of hydrofluoric acid and the like. Consequently, in this manufacturing stage, the surface areas of the electrode material in the gate electrode structures 220A, 220B, as well as portions of the electrode material 272 not covered by the cap material 206A, may be exposed and may be prepared for the further processing.

That is, if required, a further cleaning process may be applied after removal of the portions 205A (see FIG. 2E) and an appropriate metal species, such as nickel, nickel/platinum and the like, may be deposited on the basis of well-established deposition techniques, such as sputter deposition and the like, followed by a heat treatment so as to initiate a chemical reaction between the metal species and the underlying semiconductor materials, which may include a significant portion of silicon. It should be appreciated that, due to the removal of the portions 205A at any sidewall surface areas, the sidewalls of the raised semiconductor regions 271, indicated as 271S, may also be exposed, similar to any sidewall surface areas of raised drain and source regions in transistor areas during the deposition of the respective metal species and during the subsequent initiation of the chemical reaction, as will be described in more detail later on. Thereafter, any non-reacted metal species may be removed by well-established etch processes, followed by a further heat treatment in order to establish a desired crystalline configuration of the previously formed metal semiconductor compound. During the entire sequence, the cap material 206A may act as a very efficient mask material, thereby restricting formation of the semiconductor metal compound to exposed areas of the electrode material 272, while substantially maintaining the resistor body 275 as a non-reacted semiconductor material, thereby defining a respective resistance value of the resistor 270.

Figure 2G:
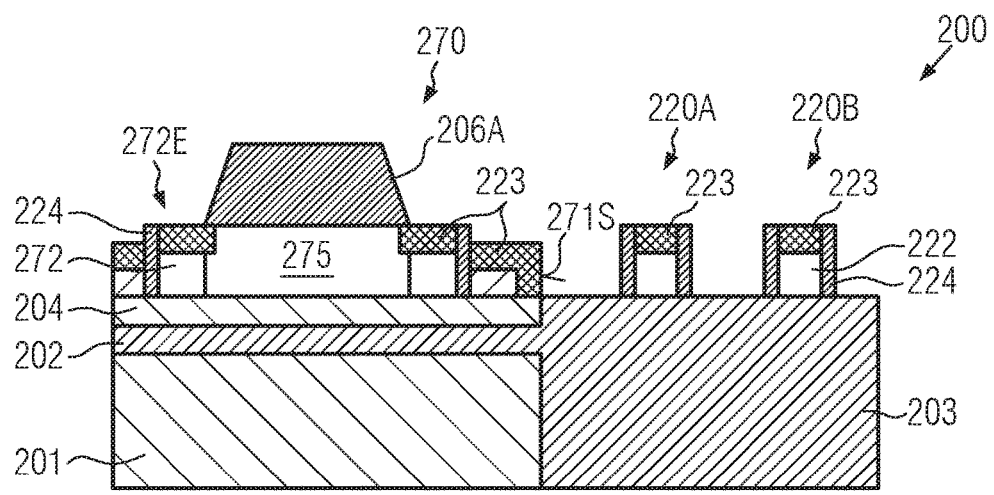

FIG. 2G schematically illustrates the semiconductor device 200 after completing the above-described process sequence. That is, the resistor 270 may comprise the resistor body 275 positioned below the cap material 206A, thereby preserving the electrode material 272 in a substantially non-silicided state, while respective end portions 272E of the electrode material 272 not covered by the cap material 206A may have formed therein respective metal semiconductor compound regions 223, for instance, provided in the form of nickel silicide, nickel/platinum silicide and the like. As discussed above, it should be appreciated that the raised semiconductor regions 271 may also comprise the metal semiconductor compound 223, which may also be formed on the distal sidewalls 271S, wherein the term "distal" is to be understood as referring to the sidewall surface that faces away from the resistor body 275. Similarly, the metal semiconductor compound regions 223 are also formed in the gate electrode structures 220A, 220B. On the other hand, when compared to the configuration as, for instance, shown in FIG. 1B, for an otherwise identical device geometry, the aspect ratio and, thus, the surface topography defined by the gate electrode structures 220A, 220B, may be significantly relaxed compared to the situation shown in FIG. 1B, since the spacers 125 of FIG. 1B are no longer present in the semiconductor device 200 due to the preceding process sequence, resulting in the omission of a specifically formed cap material for defining the semiconductor body 275.

Figure 2H:
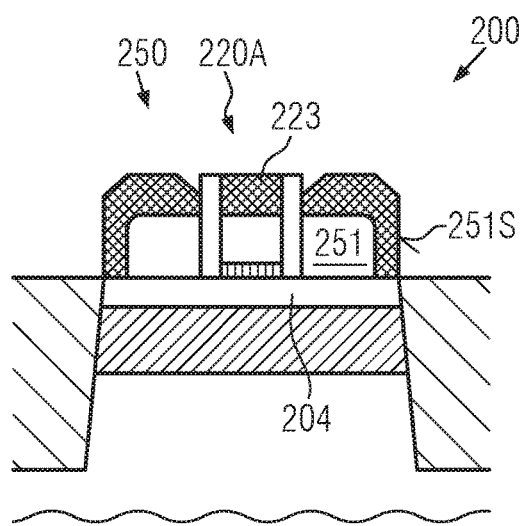

FIG. 2H schematically illustrates the semiconductor device 200 according to illustrative embodiments wherein a device region is shown that includes a transistor element 250. As previously discussed, the gate electrode structures 220A, 220B and the resistor 270 (see FIG. 2G) may be formed together with respective transistor elements, such as the transistor 250, which may, thus, comprise the raised drain and source regions 251 in combination with an appropriate gate electrode structure, such as the gate electrode structure 220A. These components may be formed on the semiconductor layer 204 having the configuration appropriate for the type and performance category of the transistor 250, as already discussed above. Moreover, due to the previously described process sequence, a sidewall 251S of the raised drain and source regions that is to be understood as a distal sidewall, i.e., a sidewall facing away from the gate electrode structure 220A, may have also experienced the process for forming the metal semiconductor compound region 223, thereby providing superior overall conductivity and less sensitivity to a subsequent process for forming contact elements connecting to the raised drain and source regions 251.

The further processing may be continued by depositing one or more appropriate dielectric materials, such as a strain-inducing dielectric material in the form of silicon nitride and the like, wherein, as discussed above, the significantly relaxed deposition constraints may provide superior efficiency and may even allow the deposition of the strain-inducing dielectric material with increased thickness, thereby contributing to superior transistor performance, while also maintaining contact-induced failures at a low level, as previously discussed with reference to FIGS. 1A and 1B. Furthermore, when patterning the respective dielectric materials (not shown) so as to form respective contact openings and filling the contact openings with appropriate conductive materials, such as tungsten and the like, the raised drain and source regions 251 may exhibit increased robustness with respect to penetration of the corresponding contact material into the semiconductor material of the raised drain and source regions 251, even if respective minor alignment errors may occur. Furthermore, the probability of creating respective "tungsten subways," as discussed with reference to FIGS. 1A and 1B, may be significantly reduced.

With reference to FIGS. 3A-3E, further illustrative embodiments will now be described in more detail, in which a selective formation of a metal semiconductor compound in resistors may be accomplished by selectively removing a metal species prior to the initiation of a respective chemical reaction.

Figure 3A:
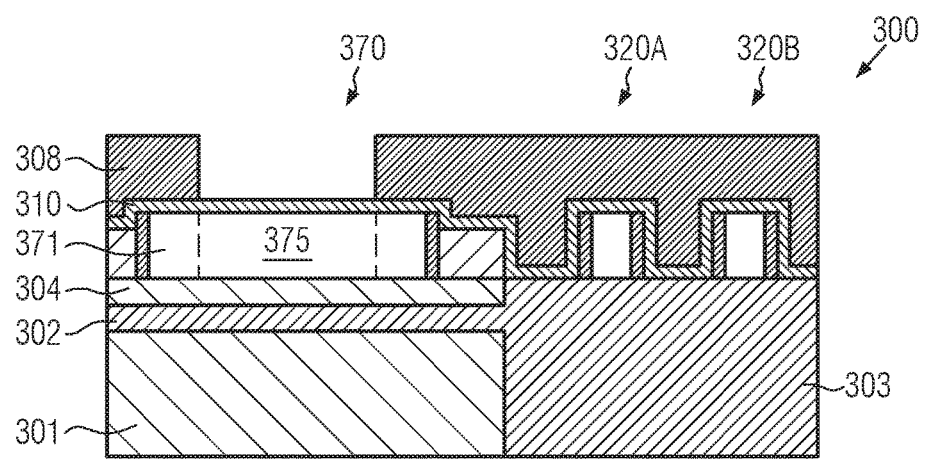
FIGS. 3A-3E schematically illustrate cross-sectional views of a semiconductor device according to still further illustrative embodiments in which portions of a resistor without metal semiconductor compounds incorporated therein may be defined by a removal process for a respective metal species.

FIG. 3A schematically illustrates a semiconductor device 300 in a moderately advanced manufacturing stage in which a resistor 370 may be provided together with gate electrode structures of lines 320A, 320B, which may be positioned above an isolation region 303. Furthermore, the device 300 may comprise a substrate material 301, a buried insulating layer 302 and a semiconductor layer 304. It should be appreciated that, for any of these components, the same criteria may apply as previously discussed with reference to the semiconductor device 200. Furthermore, the resistor 370 may comprise an electrode material 371, which may include a pronounced portion of semiconductor material, as also discussed above with reference to the electrode material 271 of the resistor 270 of the semiconductor device 200. It should be appreciated, however, that, in the manufacturing stage shown, respective cap materials may no longer be present on the electrode material 371 of the resistor 370 and the gate electrode structures 320A, 320B. Furthermore, one or more layers 310 of one or more metal species may be formed on exposed surface areas of the resistor 370 and the gate electrode structures 320A, 320B. For instance, the one or more layers 310 may comprise nickel, platinum and the like. Additionally, a mask layer 308 in the form of a resist material or any other polymer material may be provided and may be patterned so as to expose a portion of one or more metal species layer 310 that may have to be removed so as to define a resistor body 375 that may not receive a metal semiconductor compound.

The semiconductor device 300 as shown in FIG. 3A may be formed in accordance with process techniques as previously discussed in the context of the semiconductor device 200. In particular, the resistor 370 and the gate electrode structures 320A, 320B and corresponding transistor elements may be formed in accordance with overall device requirements, wherein, in particular, the patterning of the resistor 370 and the gate electrode structures 320A, 320B may be accomplished by using a dielectric cap material such as the cap material 206 (see FIG. 2A), which may be subsequently removed by a process sequence as described above with reference to FIGS. 2A-2E, except for the fact that a corresponding protective liner material, such as the mask layer 205 (see FIG. 2A), may be provided in a non-patterned manner so that, after a corresponding anisotropic etch process, only sidewall areas may remain covered by the protective liner, thereby removing the respective cap material from the gate electrode structures 320A, 320B and from the resistor 370.

Thereafter, the processing may be continued by respective cleaning processes for preparing any exposed semiconductor containing surface areas for the deposition of an appropriate metal species, as also discussed above with reference to the semiconductor device 200, thereby forming the one or more layers 310. Next, the resist mask 308 may be formed on the basis of well-established lithography techniques, wherein the resist mask 308 may be provided with sufficient thickness so as to withstand a subsequent etch process for removing an exposed portion of the one or more layers 310. It should be appreciated that the resist mask 308 may substantially represent an inverted masking regime as is typically used in the conventional strategy as described above with reference to FIGS. 1C-1E when a corresponding cap material is to be patterned in the conventional strategy for defining open areas for receiving a metal semiconductor compound. Here, the resist mask 308 may define an open area in which a metal semiconductor compound is not to be formed during the further processing, thereby defining the resistor body 375.

Figure 3B:
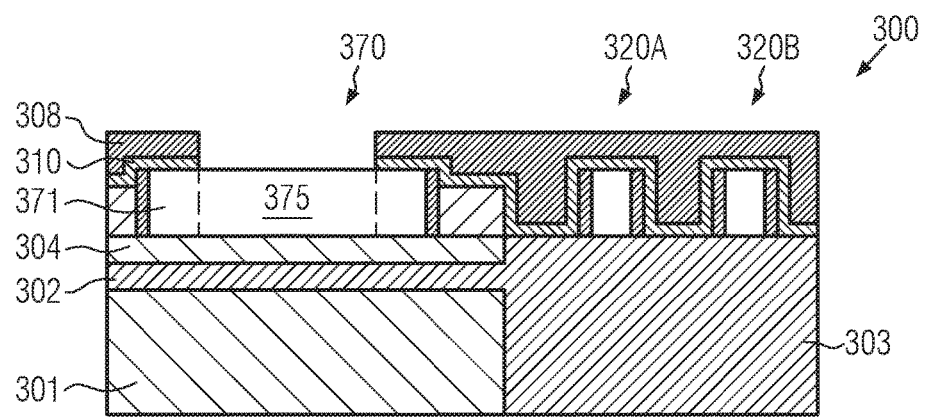

FIG. 3B schematically illustrates the semiconductor device 300 after the removal of any exposed portion of the one or more layers 310, which may be accomplished on the basis of appropriate etch recipes, including, for instance, a plasma-assisted process in which the main removal component may be obtained by physical interaction with corresponding plasma articles, rather than by introducing specific etch chemicals into the etch ambient. For example, an argon-based sputter deposition atmosphere may be established, thereby inducing a respective particle bombardment, which, in turn, may result in material removal, wherein the initial thickness of the resist mask 308 may still provide sufficient protection of any underlying surface areas, while reliably removing the exposed portions of the one or more metal-containing layers 310. It should be appreciated that appropriate process conditions for the corresponding removal process may be readily established on the basis of experiments.

Figure 3C:
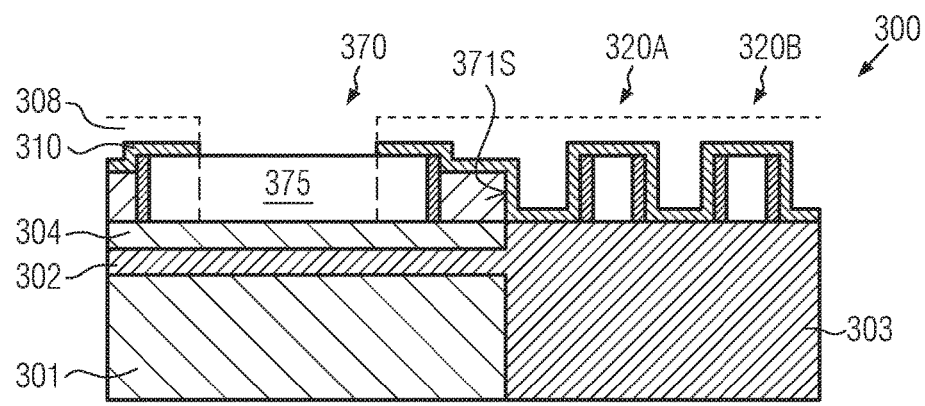

FIG. 3C schematically illustrates the semiconductor device 300 in a further advanced manufacturing stage, i.e., after removal of the remaining resist mask 308, thereby exposing the patterned one or more metal-containing layers 310. Removal of the resist mask 308 may be accomplished by applying a plasma-based resist removal process for which appropriate process parameters are available or may be readily determined on the basis of experiments. Furthermore, a further cleaning process may be performed in order to reliably remove any metal residues from the surface of the resistor body 375, for instance, by applying wet chemical recipes and the like. It should be appreciated that any possible material removal of the layer 310 during a corresponding cleaning process may be readily accommodated during the initial deposition of the material 310, so that a further processing may be continued on the basis of process conditions as required for obtaining a desired degree of semiconductor conversion into a metal semiconductor compound. It should be further appreciated that the metal layer 310 may also be formed on exposed sidewall surface areas 371S of the raised semiconductor regions and any raised drain and source regions of transistor elements, as also previously discussed in the context of the semiconductor device 200.

Thereafter, further processing may be continued by performing a heat treatment in order to initiate a chemical reaction, removing any non-reacted metal species by appropriate etch recipes, and performing a further heat treatment, if required, so as to obtain the desired configuration of the metal semiconductor compound material.

Figure 3D:
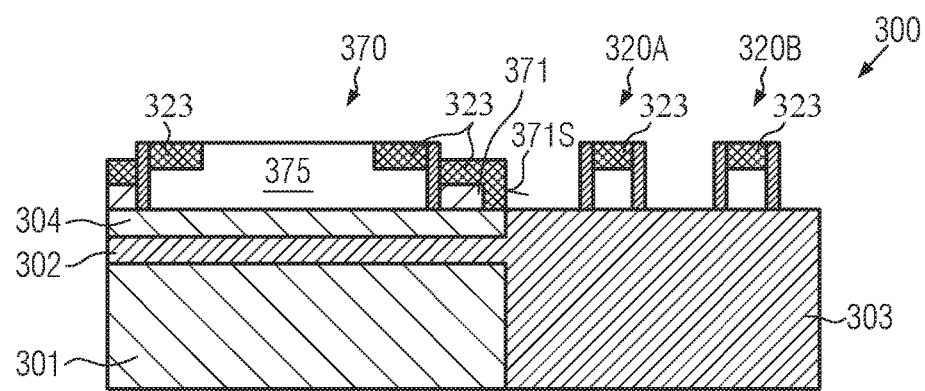

FIG. 3D schematically illustrates the semiconductor device 300 after completing the above-described process sequence. Consequently, metal semiconductor compound regions 323 may be formed in the resistor 370 so as to laterally delineate the resistor body 375, while distal sidewall surface areas 371S of the raised semiconductor regions 371 also have formed therein the metal semiconductor compound 323. Similarly, the metal semiconductor compound regions 323 may also be formed in the gate electrode structures 320A, 320B.

Figure 3E:
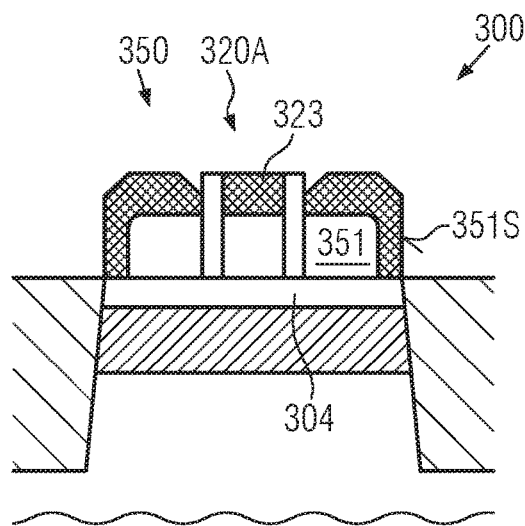

FIG. 3E schematically illustrates the semiconductor device 300, wherein the cross-section is taken at a transistor area corresponding to a transistor element 350, which may have a gate electrode structure, such as the gate electrode structure 320A and corresponding raised drain and source regions 351. The transistor 350 may be formed on the basis of an appropriate semiconductor material 304, as also previously discussed, having a desired material composition and thickness in compliance with the device requirements for the transistor 350. Moreover, distal sidewalls 351S of the raised drain and source regions 351 are also provided in the form of the metal semiconductor compound 323, as discussed above, thereby efficiently reducing the risk of punch-through events during the formation of respective contact elements connecting to the drain and source regions 351, as also discussed above with reference to the semiconductor device 200.

Consequently, the same advantages with respect to reduction of contact failures, device performance and the like may also be achieved in this case, due to the omission of forming a further cap material for defining the resistor body 375.

With reference to FIGS. 4A-4G, further illustrative embodiments will now be described, in which a resistor body, i.e., a resistor region in which a metal semiconductor compound is not to be formed, may be defined by removing a specific portion of a metal species, which may be accomplished by providing a hard mask material instead of a resist mask.

Figure 4A:
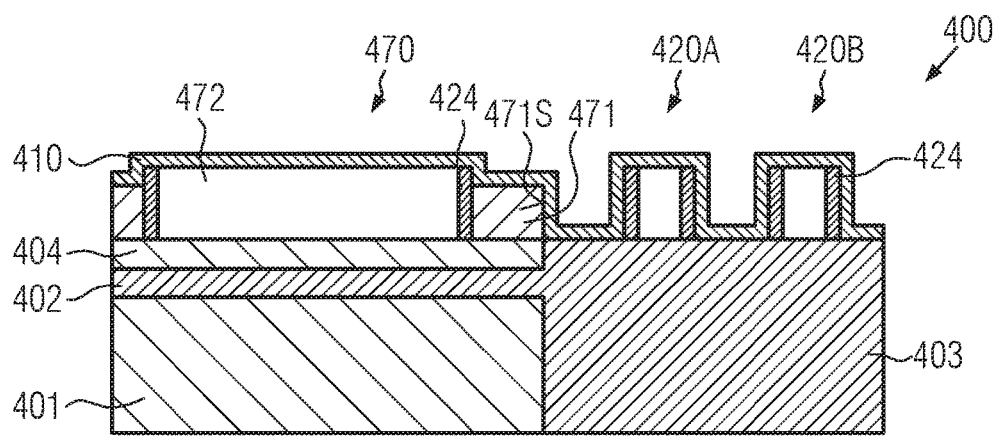
FIGS. 4A-4G schematically illustrate cross-sectional views of a semiconductor device during various manufacturing stages, wherein a metal species is appropriately patterned prior to forming a metal semiconductor compound in transistor elements and resistors, according to still further illustrative embodiments.

FIG. 4A schematically illustrates a cross-sectional view of a semiconductor device 400 comprising a resistor 470 and a plurality of gate electrode structures 420A, 420B. The semiconductor device 400 may be formed on the basis of a substrate material 401, isolation structures 403, a buried insulating layer 402, and a semiconductor layer 404, wherein, for any of these components, the same criteria may apply as previously discussed in the context of the semiconductor devices 200 and 300. The same holds true for the basic configuration of the resistor 470 and the gate electrode structures 420A, 420B. In the manufacturing stage shown, the resistor 470 may comprise an electrode material 472 and raised semiconductor regions 471 in combination with appropriate sidewall spacers 424, and the gate electrode structure 420A, 420B may also have a similar configuration. Furthermore, in this manufacturing stage, one or more metal-containing layers 410, such as layers including nickel, platinum and the like, or any combination thereof, may be formed with appropriate thickness of any exposed surface areas including, for instance, the sidewalls 471S of the raised semiconductor regions 471, in order to obtain a metal semiconductor compound during the further processing.

Generally, the semiconductor device 400 as shown in FIG. 4A may be formed on the basis of substantially the same process strategies as previously discussed with respect to the semiconductor devices 200 and 300. In particular, the resistor 470 and the gate electrode structures 420A, 420B may have been patterned on the basis of a cap material as discussed in the context of the conventional semiconductor device 100, and which may have been removed on the basis of an appropriate mask material, such as the material 205 (see FIG. 2A), as discussed above. Thereafter, the one or more metal-containing layers 410 may be deposited on the basis of well-established process recipes, wherein respective cleaning sequences may be applied. As already discussed above, deposition of the one or more layers 410 may include the deposition of two or more metals, depending on the overall device requirements.

Figure 4B:
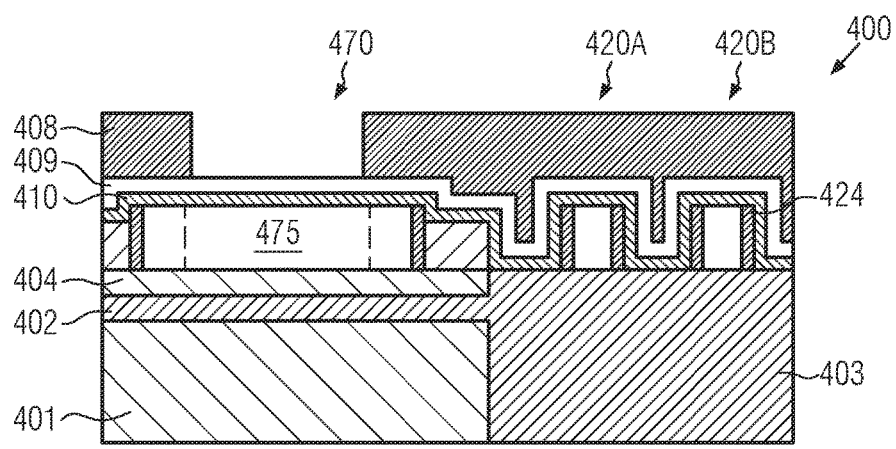

FIG. 4B schematically illustrates the semiconductor device 400 in a further advanced manufacturing stage. As illustrated, a mask layer 409, which may comprise a hard mask material, i.e., a non-polymer material, such as silicon dioxide and the like, may be formed on the layer 410, followed by a resist mask 408, which may be appropriately patterned so as to define the lateral size and shape of a resistor body 475.

The semiconductor device 400 as shown in FIG. 4B may be formed on the basis of the following processes. The hard mask material of the mask layer 409 may be formed by deposition techniques in which the temperature of the deposition ambient may be preserved at a level at which substantially no chemical reaction between the material in the one or more layers 410 and the underlying semiconductor materials may be initiated. For example, silicon dioxide material may be deposited on the basis of plasma-assisted chemical vapor deposition (CVD) techniques, in which, in particular, the process temperature may be kept at approximately 200° C. and even less, thereby substantially avoiding any unwanted chemical reaction between the materials of the layer 410 and any underlying semiconductor material. Similarly, deposition recipes for other hard mask materials, such as silicon nitride and the like, are also available for a non-critical temperature range with respect to initiating a silicidation process. Respective process parameters for such low-temperature deposition recipes may be readily determined by experiments and the like. Thereafter, the resist mask 408 may be formed on the basis of well-established lithography techniques, thereby precisely defining the resistor body 475.

Figure 4C:
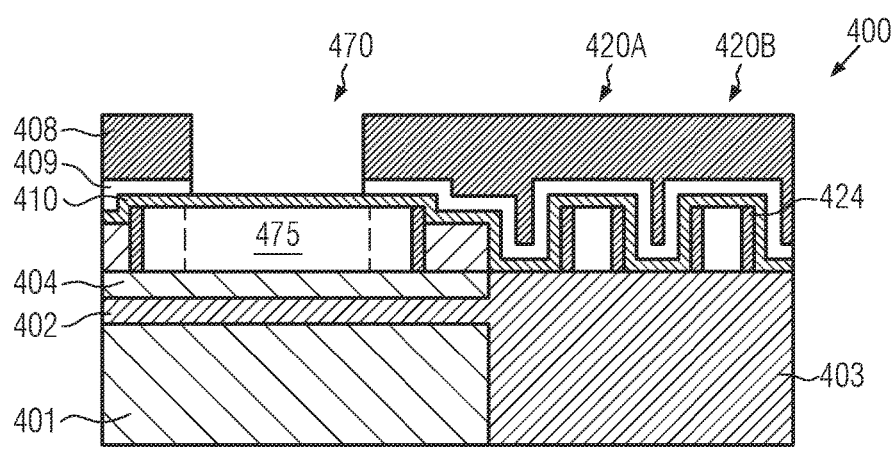

FIG. 4C schematically illustrates the semiconductor device 400 in a further advanced stage in which an exposed portion of the hard mask 409 may be removed on the basis of the resist mask 408. To this end, well-established wet chemical etch recipes, such as hydrofluoric acid or silicon dioxide as hard mask material, may be applied, while, on the other hand, the layer 410 may exhibit a pronounced etch selectivity with respect to the corresponding etch recipe. For instance, a mixture of nickel/platinum may have high etch resistivity with respect to hydrofluoric acid, thereby not unduly removing material of the layer 410.

Figure 4D:
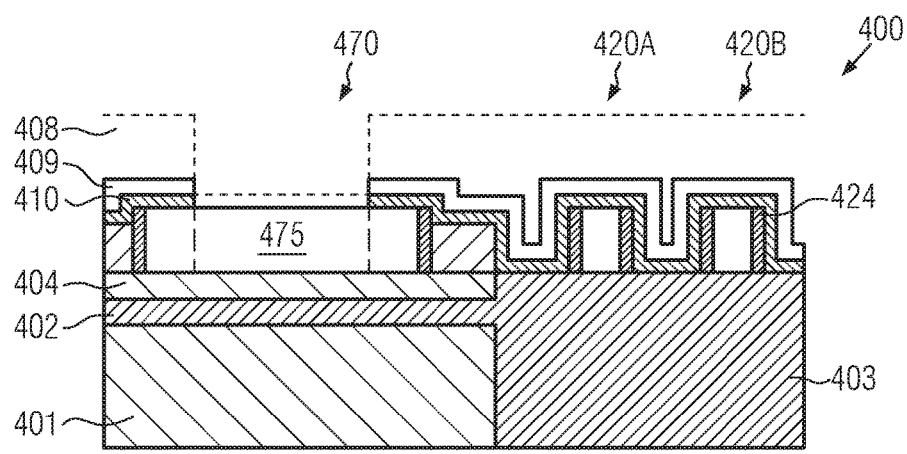

FIG. 4D schematically illustrates the semiconductor device 400 in a further advanced stage in which the resist mask 408 and a portion of the layer 410 not covered by the hard mask 409 may be removed. To this end, in some illustrative embodiments, a further wet chemical etch step may be applied, for instance, on the basis of hot SPM, i.e., a mixture of sulfuric acid and hydrogen peroxide, may be applied so as to remove the resist mask 408 and concurrently etch the exposed portion of the layer 410, while, on the other hand, the exposed surface of the resistor body 475 and the hard mask material 409 may exhibit a pronounced etch selectivity with respect to SPM. It should be appreciated that any degree of under-etching of the layer 410 in the vicinity of the lateral boundaries of the resistor body 475 may be readily taken into account upon initially defining the exposed areas on the basis of the resist mask 408. That is, an under-etching in the order of magnitude of the thickness of the layer 410 may be taken into account by appropriately dimensioning the corresponding opening of the resist mask 408 in order to arrive at a desired lateral dimension of the resistor body 475.

Figure 4E:
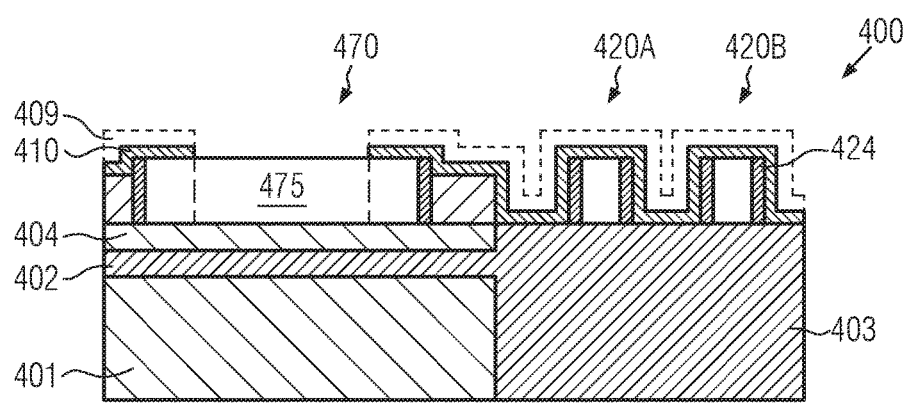

FIG. 4E schematically illustrates the semiconductor device 400 after a further etch process in order to remove the hard mask material 409 without unduly attacking the material layer 410. In some illustrative embodiments, the hard mask material 409 may be provided in the form of a silicon dioxide material, which may be efficiently removed on the basis of hydrofluoric acid, without significantly attacking the layer 410, for instance, when comprising nickel/platinum and the like. In other cases, other appropriate wet chemical etch recipes may be used, such as hot phosphoric acid and the like, in order to remove silicon nitride and the like, depending on the composition of the hard mask material 409.

It should be appreciated that the sequence of removal processes described with reference to FIGS. 4C-4E may be considered as a multistep wet chemical cleaning or etch recipe, which may be performed in the same process chamber or in a corresponding cluster tool, thereby contributing to increased overall throughput.

Figure 4F:
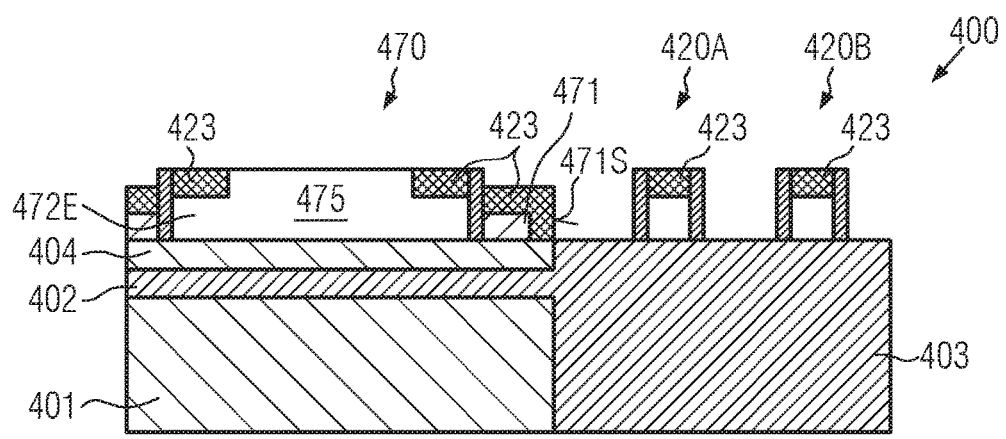

FIG. 4F schematically illustrates the semiconductor device 400 in a further advanced manufacturing stage in which metal semiconductor compound regions 423 may be provided in the resistor 470, i.e., in end portions 472E that laterally delineate the resistor body 475, in the raised semiconductor regions 471 and, in particular, at distal sidewall areas 471S, as also discussed above. Furthermore, the respective metal semiconductor compound regions 423 may also be formed in the gate electrode structures 420A, 420B. The metal semiconductor compound regions 423 may be formed in accordance with well-established process recipes as, for instance, also discussed above with reference to the semiconductor devices 200 and 300.

Figure 4G:
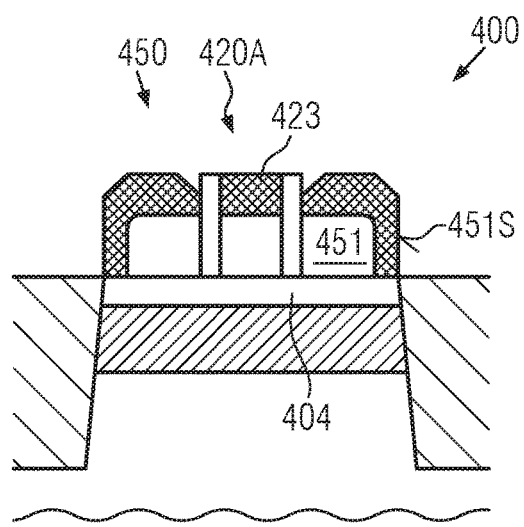

FIG. 4G schematically illustrates a cross-sectional view taken through a device region corresponding to a transistor element 450, including a gate electrode structure, such as the gate electrode structure 420A and raised drain and source regions 451. Furthermore, it should be appreciated that the transistor 450 may be formed on the basis of the semiconductor layer 404 having appropriate thickness and material composition, as previously discussed. Also in this case, the metal semiconductor compound 423 may be formed on distal sidewalls 451S of the raised drain and source regions 451, thereby imparting superior robustness to the drain and source regions 451 with respect to contact punch-through during the further processing of the semiconductor device 400, as also discussed above.

As a result, the present disclosure provides manufacturing strategies and semiconductor devices in which reduced yield loss may be achieved by significantly reducing the risk of contact failures in densely packed device areas by significantly relaxing the aspect ratio between adjacent gate electrode structures or lines formed on isolation regions and also between densely packed transistor elements. To this end, in particular, the cap material or mask material conventionally used for defining non-silicided areas in a resistor may be omitted, thereby also avoiding the formation of respective sidewall spacer elements, in addition to regular sidewall spacer elements of gate electrode structures. Therefore, a respective surface topography may be less pronounced and may provide the possibility of even increasing the thickness of any dielectric material, such as a strain-inducing dielectric material, upon depositing the dielectric materials of a contact level and/or increasing the thickness of the "regular" sidewall spacers of gate electrode structures, thereby also contributing to increased process robustness and superior transistor performance. Furthermore, the principles disclosed herein may result in an increased coverage of raised semiconductor areas, such as raised drain and source regions, thereby also imparting superior robustness to contact failures, which may be caused by slight misalignments and respective punch-through and penetration of contact metals into the raised drain and source regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a resistor and a transistor element of a semiconductor device, said transistor element comprising raised drain and source regions and a gate electrode structure, said gate electrode structure and said resistor being covered by a dielectric cap material;
    forming a mask layer above said transistor element and said resistor, said mask layer covering an upper surface and a sidewall surface of said dielectric cap material;
    patterning said mask layer so as to expose end portions of a top surface of said dielectric cap material above said resistor and to expose a top surface of said dielectric cap material above said gate electrode structure, wherein a portion of said mask layer remains on said sidewall surface of said dielectric cap material after patterning said mask layer; and
    removing said exposed portions of said dielectric cap material by using said patterned mask layer as an etch mask.

2. The method of claim 1, wherein said resistor comprises a first sidewall spacer and said transistor element comprises a second sidewall spacer positioned between said gate electrode structure and said raised drain and source regions, said mask layer covers portions of said first and second sidewall spacers, and patterning said mask layer comprises forming a resist mask above said resistor and performing an anisotropic etching process so as to preserve said mask layer covering said portions said first and second sidewall spacers.

3. The method of claim 2, further comprising forming a metal semiconductor compound in semiconductor surface areas exposed by removing said exposed portions of said dielectric cap material.

4. The method of claim 3, further comprising removing said patterned mask layer and forming said metal semiconductor compound on exposed sidewalls of said raised drain and source regions.

5. The method of claim 1, wherein said mask layer and said dielectric cap material have different material compositions.

6. The method of claim 5, wherein said mask layer and said dielectric cap material comprise silicon dioxide and silicon nitride, respectively.

7. The method of claim 1, wherein forming said transistor element comprises forming said gate electrode structure with a gate length of approximately 30 nm or less.

8. A method, comprising:
    forming a resistor and a transistor element having a gate electrode structure, said transistor element having raised drain and source regions, said gate electrode structure and said resistor being covered by a dielectric cap material;
    removing said dielectric cap material so as to expose top surfaces of said resistor and said transistor element;
    forming a metal containing layer on said top surface of said resistor and above said transistor element;
    removing a portion of said metal containing layer above a central portion of said top surface of said resistor, wherein remaining portions of said metal containing layer remain on end portions of said top surface of said resistor adjacent said central portion; and
    forming a metal semiconductor compound in and on semiconductor surface areas covered by said remaining portions of said metal containing layer.

9. The method of claim 8, wherein removing said portion of said metal containing layer above said central portion of said top surface of said resistor comprises forming a resist mask above said metal containing layer so as to expose said metal containing layer at said central portion of said top surface of said resistor and removing said exposed metal containing layer by using said resist mask.

10. The method of claim 9, wherein removing said exposed metal containing layer comprises performing a sputter etching process.

11. The method of claim 10, further comprising performing a resist removal process prior to forming said metal semiconductor compound.

12. The method of claim 8, wherein removing said portion of said metal containing layer above said central portion of said top surface of said resistor comprises forming a hard mask above said metal containing layer so as to expose said metal containing layer at said central portion of said top surface of said resistor and removing said exposed metal containing layer by using said hard mask.

13. The method of claim 12, wherein forming said hard mask comprises forming a non-polymer material layer above said resistor and said transistor element and patterning said non-polymer material layer by using a resist mask.

14. The method of claim 13, wherein forming said non-polymer material layer comprises depositing said non-polymer material layer in a deposition ambient without initiating a reaction between said metal containing layer and semiconductor material.

15. The method of claim 14, wherein a temperature of said deposition ambient is maintained at approximately 200° C. or less.

16. The method of claim 13, further comprising removing said resist mask and concurrently removing said portion of said metal containing layer exposed by said resist mask and said hard mask.

17. A semiconductor device, comprising
a transistor element including a gate electrode structure and first raised drain and source regions positioned laterally adjacent to at least a portion of said gate electrode structure, a distal sidewall of said first raised drain and source regions with respect to said gate electrode structure being formed of a first compound formed of a semiconductor material of said first raised drain and source regions and a metal; and
a resistor comprising a semiconductor resistor body, contact regions connecting to said resistor body and containing a second compound formed of a semiconductor material of said resistor body and a metal, and second raised drain and source regions positioned laterally adjacent to said resistor body.

18. The semiconductor device of claim 17, wherein a length of an electrode material of said gate electrode structure is approximately 30 nm or less.

19. The semiconductor device of claim 17, further comprising a plurality of adjacent gate electrode lines, wherein a lateral spacing between two adjacent gate electrode lines is approximately 80 nm or less.

20. The semiconductor device of claim 17, further comprising a semiconductor layer with a thickness of 15 nm or less formed on a buried insulating layer, wherein said resistor and said gate electrode structure are formed on said semiconductor layer.

* * * * *